(12) United States Patent
Doi (10) Patent No.: US 9,530,481 B2
(45) Date of Patent: Dec. 27, 2016

(54) FERROELECTRIC RANDOM ACCESS MEMORY WITH PLATE LINE DRIVE CIRCUIT

(71) Applicant: LAPIS Semiconductor Co., Ltd., Yokohama (JP)

(72) Inventor: Hitoshi Doi, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 14/863,953

(22) Filed: Sep. 24, 2015

(65) Prior Publication Data

US 2016/0086648 A1 Mar. 24, 2016

(30) Foreign Application Priority Data

Sep. 24, 2014 (JP) .................. 2014-193886

(51) Int. Cl.
*G11C 16/04* (2006.01)
*G11C 11/22* (2006.01)

(52) U.S. Cl.
CPC .......... *G11C 11/2257* (2013.01); *G11C 11/221* (2013.01); *G11C 11/22* (2013.01)

(58) Field of Classification Search
CPC ..... G11C 11/2257; G11C 11/221; G11C 11/22
USPC ........................................ 365/145
See application file for complete search history.

(56) References Cited

U.S. PATENT DOCUMENTS

| 5,991,188 A * | 11/1999 | Chung | G11C 11/22 365/145 |
| 7,233,536 B2 * | 6/2007 | Ogiwara | G11C 11/22 365/205 |
| 2006/0067138 A1 * | 3/2006 | Ogiwara | G11C 11/22 365/189.09 |

FOREIGN PATENT DOCUMENTS

JP 2004-227663 A 8/2004

* cited by examiner

*Primary Examiner* — Richard Elms
*Assistant Examiner* — Xiaochun L Chen
(74) *Attorney, Agent, or Firm* — Rabin & Berdo, P.C.

(57) ABSTRACT

A ferroelectric random access memory includes a memory cell matrix constituted by a plurality of 1T1C type memory cells. Each of the plurality of memory cells is connected to a j bit line and one pair of k word lines and k plate lines. A plate line drive circuit selectively applies one of a first potential and a second potential having a higher potential level than the first potential to one plate line of the k plate lines. An equalizing circuit performs an equalizing process in which the first potential is applied to each of the j bit lines. The plate line drive circuit applies a third potential having a potential level between the first and second potentials to the one plate line, before starting the equalizing process by the equalizing circuit.

10 Claims, 7 Drawing Sheets

FERROELECTRIC RANDOM ACCESS MEMORY WITH PLATE LINE DRIVE CIRCUIT

BACKGROUND OF THE INVENTION

1. Field of the Invention

The present invention relates to a semiconductor memory, more particularly a ferroelectric random access memory using a ferroelectric material.

2. Description of the Related Background Art

There is a ferroelectric random access memory (FeRAM) as a semiconductor memory that can record binary data in a nonvolatile manner using the magnitude between two different polarizations of a ferroelectric substance, with taking advantage of a hysteresis characteristic of the ferroelectric substance.

As a capacitor type FeRAM using a ferroelectric material as a capacitor, there are a 1T1C type FeRAM in which one memory cell has one transistor and one ferroelectric capacitor and a 2T2C type FeRAM in which one memory cell has two transistors and two ferroelectric capacitors.

One of the main differences between the 1T1C type FeRAM and the 2T2C type FeRAM is that the 1T1C type FeRAM has a smaller memory cell in size. Thus, a 1T1C memory cell configuration tends to be used when designing FeRAMs, in accordance with increase in memory capacity and miniaturization thereof.

Japanese Patent Application Kokai No. 2004-227663 discloses a ferroelectric memory device having a plurality of cell groups each of which includes first and second reference cells, first and second memory cells, a first reference cell reset circuit, a MOS transistor functioning as a first reference level equalizer, and the like. A reference cell reset driver is provided for each of the plurality of cell groups.

Some semiconductor memories, including FeRAMs, are configured such that a single signal controls reading and writing of data on a plurality of memory cells, in consideration of simultaneous access (reading and writing in the same timing) to a plurality of bits. To produce such an FeRAM that supports the simultaneous access to the plurality of memory cells, for example, a plurality of ferroelectric capacitors are connected to one signal line (plate line) in the FeRAM.

In the FeRAM having a configuration such that the plurality of ferroelectric capacitors are connected to the one plate line, the potential of the plate line is likely to vary for a short time to an unintended level during the reading and writing of data. This is because electric charge held in each of the plurality of ferroelectric capacitors becomes noise during the reading and writing of data, and causes variation in the potential of the plate line. Thereby, the residual polarization value of the ferroelectric capacitors, which represents data of the memory cells, may be reduced, thus deteriorating data retention characteristics.

The deterioration in the data retention characteristics, owing to the reduction in the residual polarization value, becomes not negligible with increase in the number of the memory cells connected to one plate line. Moreover, it is often difficult to suppress the brief variation itself in the potential of the plate line.

The degree of the potential variation in the plate line depends on data written to the memory cells. Thus, the more the number of combinations (worst cases) of data that is the most likely to cause the potential variation in the plate line is, the more the number of screenings of the memory cells and the time for the screenings in a test before shipment are.

SUMMARY OF THE INVENTION

Considering the problems described above, an object of the present invention is to provide a ferroelectric random access memory that has good data retention characteristics by preventing a reduction in the residual polarization value of ferroelectric capacitors owing to potential variation of a plate line.

A ferroelectric random access memory according to the present invention comprises: a memory cell matrix constituted by a plurality of 1T1C type memory cells of j rows and k columns (j is an integer of 2 or more and k is an integer of 1 or more), and having j bit lines, k word lines, and k plate lines, the k word lines and the k plate lines being paired with each other, and each of the plurality of 1T1C type memory cells being connected to one of the j bit lines and one pair of the k word lines and the k plate lines; a word line drive circuit which selects either one word line of the k word lines in accordance with a selection signal; a plate line drive circuit which selects one plate line of the k plate lines paired with the selected one word line, and selectively applies one of a first potential and a second potential having a higher potential level than the first potential to the one plate line; and an equalizing circuit which performs an equalizing process in which the first potential is applied to each of the j bit lines, wherein the plate line drive circuit applies a third potential having a potential level between the first and second potentials to the one plate line, before starting the equalizing process by the equalizing circuit.

According to the present invention, it is possible to reduce effect of potential variation of the plate line on the residual polarization value of the ferroelectric capacitors, and thus provide a FeRAM that has good data retention characteristics and reduced power consumption.

DETAILED DESCRIPTION OF THE INVENTION

Embodiments of the present invention will be hereinafter described in detail.

[First Embodiment]

Figure 1:
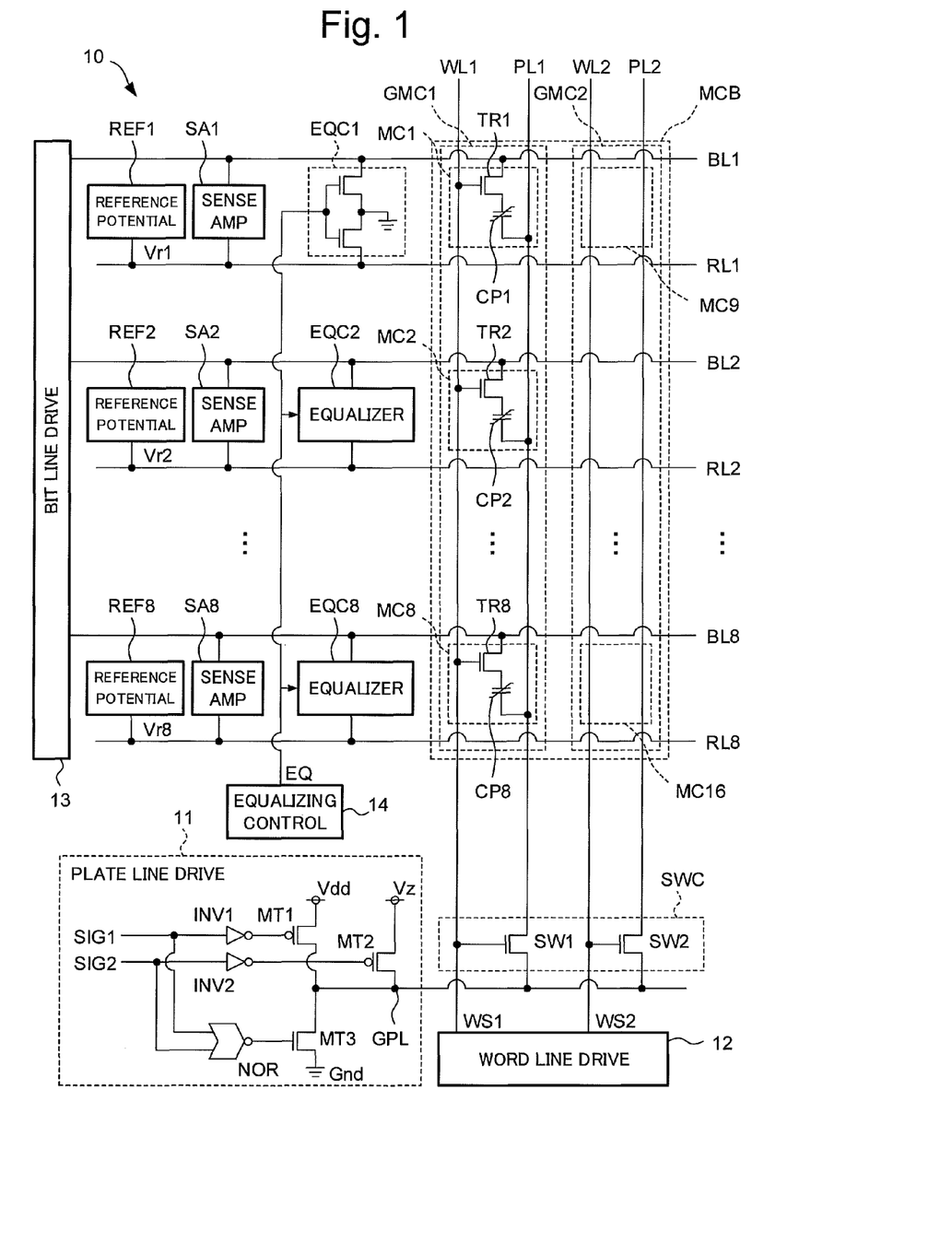
FIG. 1 is a circuit diagram showing a configuration of a FeRAM according to a first embodiment.

FIG. 1 is a circuit diagram showing a configuration of a ferroelectric random access memory (FeRAM) 10 according to a first embodiment of the present invention. The FeRAM 10 has a memory cell block (hereinafter simply called cell block) MCB which is a memory cell matrix constituted by a plurality of memory cells having a 1T1C configuration. The plurality of memory cells are connected to j bit lines and k word lines, and arrayed in a matrix of j rows and k columns (j is an integer of 2 or more and k is an integer of 1 or more). The memory cell block MCB includes the plurality of memory cells each of which has one transistor (hereinafter called cell transistor) for cell selection and one ferroelectric capacitor (hereinafter simply called capacitor).

This embodiment represents the case of j=8 and k=2, namely, sixteen memory cells MC1 to MC16 are connected to eight bit lines BL1 to BL8 and two word lines WL1 and WL2. The cell block MCB has the sixteen memory cells MC1 to MC16 arrayed in eight rows and two columns. The memory cell MC1 has a cell transistor TR1 and a capacitor CP1 one end of which is connected to a drain of the cell transistor TR1. Similarly, each of the memory cells MC2 to MC16 has one of cell transistors TR2 to TR16 and one of capacitors CP2 to CP16. For the sake of clarity in the drawing, the memory cells MC3 to MC7 and MC9 to MC16 are not shown.

Groups of the memory cells arrayed in a column direction are referred to below as memory cell groups. As shown in FIG. 1, the eight memory cells MC1 to MC8 arrayed in a first column constitute a memory cell group GMC1 as a whole. The eight memory cells MC9 to MC16 arrayed in a second column constitute a memory cell group GMC2 as a whole.

The word line WL1 is connected to a gate of each of the cell transistors TR1 to TR8 of the memory cells MC1 to MC8 in the first column, that is, in the memory cell group GMC1. The word line WL2 is connected to a gate of each of the cell transistors TR9 to TR16 (not shown) of the memory cells MC9 to MC16 in the second column, that is, in the memory cell group GMC2.

The bit line BL1 is connected to a source of each of the cell transistors TR1 and TR9 of the memory cells in the first row, that is, the memory cells MC1 and MC9. In other words, the bit line BL1 is connected to one end of each of the capacitors CP1 and CP9 through the cell transistors TR1 and TR9 in the memory cells MC1 and MC9 in the first row. Similarly, the bit lines BL2 to BL8 are connected to the memory cells in the second to eighth rows, respectively.

In other words, the FeRAM 10 comprises the eight bit lines BL1 to BL8 extending in the row direction, the two word lines WL1 and WL2 extending in the column direction, and the sixteen memory cells MC1 to MC16 disposed at intersections of the bit lines BL1 to BL8 and the word lines WL1 and WL2.

The FeRAM 10 comprises two plate lines PL1 and PL2 each of which is connected to the capacitors in the same column in the cell block MCB. In particular, as shown in FIG. 1, the plate line PL1 is connected to the capacitors in the first column, that is, the other end of each of the capacitors CP1 to CP8 of the memory cells MC1 to MC8 in the memory cell group GMC1. The plate line PL2 is connected to the capacitors in the second column, that is, the other end of each of the capacitors CP9 to CP16 (not shown) of the memory cells MC9 to MC16 in the memory cell group GMC2. The plate line PL1 is paired with the word line WL1. The plate line PL2 is paired with the word line WL2.

The FeRAM 10 comprises the memory cell group GMC1 having the memory cells MC1 to MC8 connected to the word line WL1 and the plate line PL1 paired with each other, and the memory cell group GMC2 having the memory cells MC9 to MC16 connected to the word line WL2 and the plate line PL2 paired with each other.

One-bit data i.e. data "0" or data "1" is written to each of the memory cells MC1 to MC16 by using the bit lines BL1 to BL8, the word lines WL1 and WL2, and the plate lines PL1 and PL2. Each of the capacitors CP1 to CP16 holds a polarization (for example, negative polarization) state corresponding to the data "0" or a polarization (for example, positive polarization) state corresponding to the data "1".

In the FeRAM 10, data (eight-bit data in this embodiment) can be simultaneously read from or written to the individual memory cells of the memory cell group GMC1 or GMC2 by using the plate lines PL1 and PL2.

The bit lines BL1 to BL8 are provided with reference lines RL1 to RL8, which are signal lines paired with the bit lines BL1 to BL8, respectively. Reference potentials (standard potentials) Vr1 to Vr8 for data determination are applied to the reference lines RL1 to RL8, respectively. To the reference lines RL1 to RL8, reference potential generation circuits REF1 to REF8 are connected to generate the reference potentials Vr1 to Vr8, respectively.

To the bit line BL1 and the reference line RL1, a sense amplifier SA1 is connected. The sense amplifier SA1 compares a read potential appearing from the capacitor CP1 to the bit line BL1 with the reference potential Vr1 applied to the reference line RL1, to determine whether the data that has been written in the memory cell MC1 is the data "0" or the data "1". The sense amplifier SA1 applies a power source potential Vdd to one of the bit line BL1 and the reference line RL1 and applies a ground potential Gnd to the other, in accordance with the data of the memory cell MC1.

When the read potential appearing in the bit line BL1 is lower than the reference potential Vr1, for example, the sense amplifier SA1 judges that the data "0" has been written in the memory cell MC1. When the read potential appearing in the bit line BL1 is higher than the reference potential Vr1, the sense amplifier SA1 judges that the data "1" has been written in the memory cell MC1. In the same manner, sense amplifiers SA2 to SA8 are provided for the bit lines BL2 to BL8 and the reference lines RL2 to RL8, respectively.

The bit line BL1 and the reference line RL1 are provided with an equalizing circuit (equalizer) EQC1 which performs an equalizing process in which the ground potential Gnd is applied to the bit line BL1 and the reference line RL1 on the basis of an equalize signal EQ. The equalizing circuit EQC1 equalizes the potentials of the bit line BL1 and the reference line RL1. The equalizing circuit EQC1 has two n-channel MOS transistors connected in series between the bit line BL1 and the reference line RL1. The midpoint between the two MOS transistors is grounded, and the equalizing signal EQ is input to a gate of each transistor. In the same manner, the bit lines BL2 to BL8 and the reference lines RL2 to RL8 are provided with equalizing circuits (equalizers) EQC2 to EQC8, respectively.

It is noted that the bit lines BL1 to BL8 are provided with the equalizing circuits EQC1 to EQC8, respectively, in this embodiment, but one equalizing circuit may apply the equalizing process to the bit lines BL1 to BL8. In other words, the number of the equalizing circuits is changeable as long as the equalizing process, which applies the ground potential Gnd to each of the bit lines BL1 to BL8, is performed on the basis of the equalizing signal EQ.

The FeRAM 10 has a plate line drive circuit 11 which applies potentials to the respective plate lines PL1 and PL2, a word line drive circuit 12 which applies potentials to the respective word lines WL1 and WL2, and a bit line drive circuit 13 which applies potentials to the respective bit lines BL1 to BL8.

In response to selection of the word line, the plate line drive circuit 11 applies a driving potential to the plate line corresponding to the selected word line. More specifically, when the word line WL1 is selected, the plate line drive circuit 11 applies the driving potential to the plate line PL1 corresponding to the word line WL1. When the word line WL2 is selected, the plate line drive circuit 11 applies the driving potential to the plate line PL2. The word line WL1 and the plate line PL1 are utilized in a pair, while the word line WL2 and the plate line PL2 are utilized in a pair.

The plate line drive circuit 11 selectively applies one of the ground potential (first potential) Gnd and the power source potential (second potential) Vdd to one plate line (PL1 or PL2) of the plate lines PL1 and PL2 as the driving potential, on the basis of an input control signal (first control signal) SIG1. The ground potential Gnd corresponds to a level "L" (first logic level). The power source potential (second potential) Vdd corresponds to a level "H" (second logic level) and has a higher potential level than the ground potential Gnd.

The plate line drive circuit 11 applies a noise absorption potential (third potential) Vz to the one plate line of the plate lines PL1 and PL2, on the basis of an input control signal (second control signal) SIG2. The noise absorption potential Vz has a potential level between the ground potential Gnd and the power source potential Vdd.

In other words, the plate line drive circuit 11 selectively applies one of the ground potential Gnd, the power source potential Vdd, and the noise absorption potential Vz to the plate lines PL1 and PL2 on the basis of the control signals SIG1 and SIG2.

The FeRAM 10 has a switch circuit SWC for switching to the one plate line, between the two plate lines PL1 and PL2. For example, the switch circuit SWC conducts between the one plate line and the plate line drive circuit 11, in accordance with the selection of the word line.

For example, when the word line WL1 is selected and the plate line PL1 corresponding to the word line WL1 is selected as the one plate line, the switch circuit SWC becomes a conduction state and electrically connects between the one plate line PL1 and the plate line drive circuit 11. When the word line WL1 is selected, the switch circuit SWC disconnects the plate line PL2 (plate line corresponding to the unselected word line WL2) which is not the one plate line.

More specifically, the switch circuit SWC includes a switch SW1 for switching the conduction and non-conduction between the plate line drive circuit 11 and the plate line PL1, and a switch SW2 for switching the conduction and non-conduction between the plate line drive circuit 11 and the plate line PL2. The plate line drive circuit 11 is connected to the plate lines PL1 and PL2 through the switches SW1 and SW2, respectively. The switch SW1 includes, for example, an n-channel MOS transistor which has a source connected to the plate line PL1, a gate connected to the word line WL1, and a drain connected to the plate line drive circuit 11. The switch SW2 includes an n-channel MOS transistor which has a source connected to the plate line PL2, a gate connected to the word line WL2, and a drain connected to the plate line drive circuit 11.

As shown in FIG. 1, the plate line drive circuit 11 includes inverter circuits INV1 and INV2, a negative OR circuit NOR, p-channel MOS transistors MT1 and MT2, and an n-channel MOS transistor MT3.

The control signal SIG1 is input to an input terminal of the inverter circuit INV1. The control signal SIG2 is input to an input terminal of the inverter circuit INV2. An output terminal of the inverter circuit INV1 is connected to a gate of the MOS transistor MT1. An output terminal of the inverter circuit INV2 is connected to a gate of the MOS transistor MT2. The power source potential Vdd is applied to a source of the MOS transistor MT1. The noise absorption potential Vz is applied to a source of the MOS transistor MT2.

The control signals SIG1 and SIG2 are input to input terminals of the negative OR circuit NOR. An output terminal of the negative OR circuit NOR is connected to a gate of the MOS transistor MT3. A source of the MOS transistor MT3 is connected to drains of the MOS transistors MT1 and MT2. A drain of the MOS transistor MT3 is grounded. The drain of the MOS transistor MT2 is connected to the switches SW1 and SW2.

A connection node between the plate line drive circuit 11 and the plate line PL1, that is, a connection node between the drain of the MOS transistor MT2 and the switches SW1 and SW2 is hereinafter referred to as a node GPL.

The plate line drive circuit 11 applies the noise absorption potential Vz (potential having a potential level between the ground potential Gnd and the power source potential Vdd) to the one plate line (plate line PL1 or PL2), before starting the equalizing process by the equalizing circuits EQC1 to EQC8. In other words, the plate line drive circuit 11 precharges the plate lines PL1 and PL2 with the noise absorption potential Vz, before the equalizing circuits EQC1 to EQC8 apply the ground potential Gnd to the bit lines BL1 to BL8, respectively.

The word line drive circuit 12 is connected to the word lines WL1 and WL2, and applies a potential signal WS1 or WS2 to one of the word lines WL1 and WL2 in accordance with a selection signal. The bit line drive circuit 13 applies a write potential to the bit lines BL1 to BL8. The FeRAM 10 has an equalizing control circuit 14, which produces the equalizing signal EQ to control the operation of each of the equalizing circuits EQC1 to EQC8.

Figure 2:
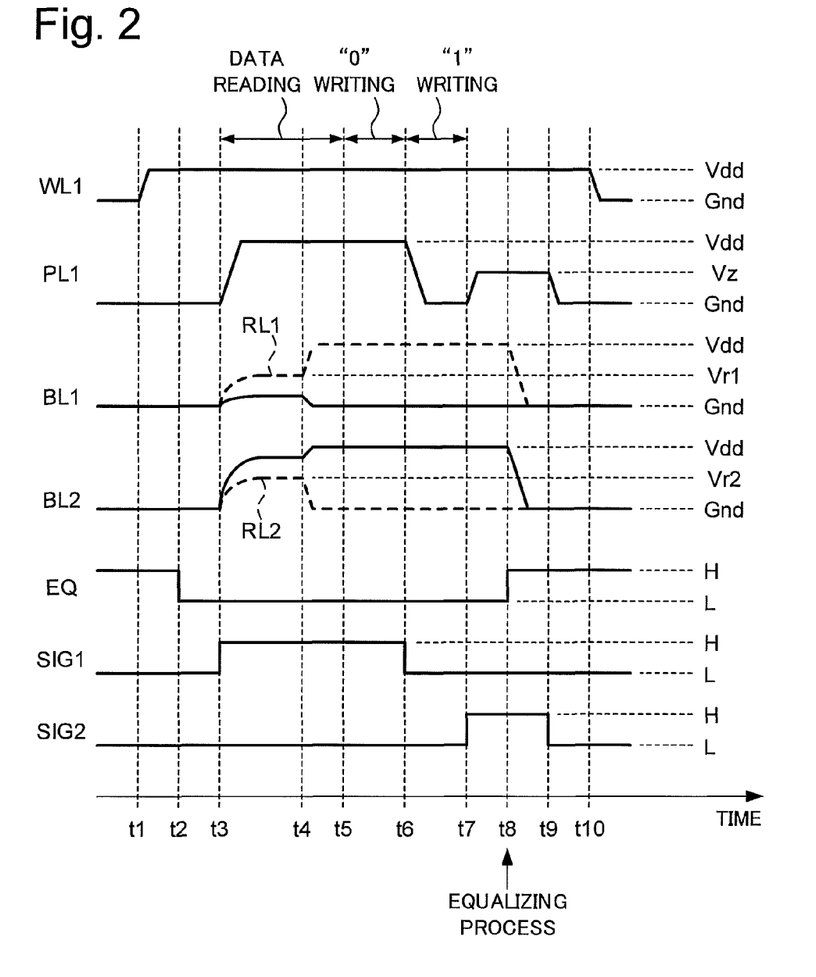
FIG. 2 is a time chart of a reading and writing operation of data in the FeRAM according to the first embodiment.

FIG. 2 is the time chart showing a sequential reading and writing operation on the FeRAM 10. FIG. 2 shows potential levels of the word line WL1, the plate line PL1, the bit line BL1, the reference line RL1, the bit line BL2, and the reference line RL2 during the reading and writing operation. For the sake of explanation, FIG. 2 shows waveforms (potential levels) of the equalizing signal EQ and the control signals SIG1 and SIG2.

A description will be given below of the case where the data "0" has already been written to the memory cell MC1, and the data "1" has already been written to the memory cells MC2 to MC8. Also, how to write the data "0" to the memory cell MC1 and the data "1" to the memory cells MC2 to MC8 will be described.

Since the same reading and writing operation is performed on the memory cells MC2 to MC8, variation in a waveform of potential level of the memory cells MC3 to MC8 is the same as that of the memory cell MC2. Thus, the memory cell MC2 will be described as the description of the memory cells MC2 to MC8. In the same manner, the bit line BL2 will be described as a representative of the bit lines BL2 to BL8, and the reference line RL2 will be described as a representative of the reference lines RL2 to RL8.

As to the bit lines BL1 and BL2 and the reference lines RL1 and RL2, solid lines represent variations in potential levels of the bit lines BL1 and BL2, while broken lines represent variations in potential levels of the reference lines RL1 and RL2. A portion in which the bit line BL1 and the reference line RL1 have the same potential level is represented by the solid line. The same goes for the bit line BL2 and the reference line RL2.

Before reading data, the ground potential Gnd is applied to the word line WL1 and the plate line PL1 by the drive circuits 12 and 11. The control signals SIG1 and SIG2 input to the plate line drive circuit 11 are at the level "L". The equalizing signal EQ is at the level "H". The bit lines BL1 and BL2 and the reference lines RL1 and RL2 are at the ground potential level Gnd (potential level "0").

First at a time t1, the word line drive circuit 12 applies the power source potential Vdd as the potential signal WS1 to the word line WL1. In other words, the word line WL1 is selected for driving the memory cell group GMC1. Thereby, the cell transistors TR1 and TR2 of the memory cells MC1 and MC2 are brought into a conduction state between their source and drain. Thus, the cell transistor TR1 conducts between the bit line BL1 and the plate line PL1 through the capacitor CP1, and the cell transistor TR2 conducts between the bit line BL2 and the plate line PL1 through the capacitor CP2.

That is, the memory cells MC1 and MC2 are selected as the memory cells to be read and written. The switch SW1 becomes a conduction state, and hence the plate line PL1 is selected as the one plate line by the plate line drive circuit 11. It is noted that the reading and writing operation is performed, as described below, on the memory cells MC3 to MC8, in the same manner on the memory cell MC2. Thus, variation in potential level of the memory cells MC3 to MC8 is the same as that of the memory cell MC2.

At a time t2, the equalizing signal EQ falls to the level "L". Thereby, the equalizing process by the equalizing circuits EQC1 and EQC2 is stopped. The bit lines BL1 and BL2 and the reference lines RL1 and RL2 are brought into a floating state.

At a time t3, the control signal SIG1 rises to the level "H", so that the power source potential Vdd is applied to the plate line PL1. Thereby, the read potentials appear in the bit lines BL1 and BL2 from the capacitors CP1 and CP2, respectively. At the same time, the reference potential generation circuit REF1 applies the reference potential Vr1 to the reference line RL1, and the reference potential generation circuit REF2 applies the reference potential Vr2 to the reference line RL2.

At a time t4, the sense amplifiers SA1 and SA2 judge the data that has been written in the memory cells MC1 and MC2, respectively. More specifically, the read potential appearing in the bit line BL1 is lower than the reference potential Vr1 applied to the reference line RL1. Therefore, the sense amplifier SA1 judges that the data "0" has been written in the memory cell MC1. The sense amplifier SA1 applies the ground potential Gnd to the bit line BL1, and applies the power source potential Vdd to the reference line RL1.

In the same manner, the read potential appearing in the bit line BL2 is higher than the reference potential Vr2 applied to the reference line RL2. Therefore, the sense amplifier SA2 judges that the data "1" has been written in the memory cell MC2. The sense amplifier SA2 applies the power source potential Vdd to the bit line BL2, and applies the ground potential Gnd to the reference line RL2. In this manner, the data "0" is read from the memory cell MC1, and the data "1" is read from the memory cell MC2.

At a time t5, the data "0" is written to the memory cell MC1. In particular, the bit line drive circuit 13 applies the ground potential Gnd to the bit line BL1. The control signal SIG1 is at the level "H", so that the plate line drive circuit 11 applies the power source potential Vdd to the plate line PL1. In this embodiment, there is no potential variation in the bit line BL1 and the plate line PL1 at this time.

At a time t6, the data "1" is written to the memory cell MC2. In particular, the bit line drive circuit 13 applies the power source potential Vdd to the bit line BL2. The control signal SIG1 is at the level "L", so that the plate line drive circuit 11 applies the ground potential Gnd to the plate line PL1. In this embodiment, the potential of the plate line PL1 falls from the power source potential Vdd to the ground potential Gnd at this time. In this manner, the data "0" is written to the memory cell MC1, and the data "1" is written to the memory cell MC2.

At a time t7, the control signal SIG2 rises to the level "H", so that the plate line drive circuit 11 applies the noise absorption potential Vz to the plate line PL1. Then, at a time t8, the equalizing signal EQ rises to the level "H" to perform the equalizing process in which the ground potential Gnd is applied to the bit lines BL1 and BL2 and the reference lines RL1 and RL2. At a time t9, the control signal SIG2 falls to the level "L", so that the plate line drive circuit 11 applies the ground potential Gnd to the plate line PL1. In this manner, the equalizing process is performed on each of the bit lines and the reference lines. Then, a data write termination process is performed.

Finally, at a time t10, the word line drive circuit 12 applies the ground potential Gnd to the word line WL1 to bring the cell transistors TR1 and TR2 into a non-conduction state between their source and drain. In other words, the selection of the memory cells MC1 and MC2, as the memory cells to be read and written, is canceled. The sequential operation including the selection of the memory cells, the reading and writing of data, and the cancellation of the selection of the memory cells is performed just as described above.

Figure 3A:
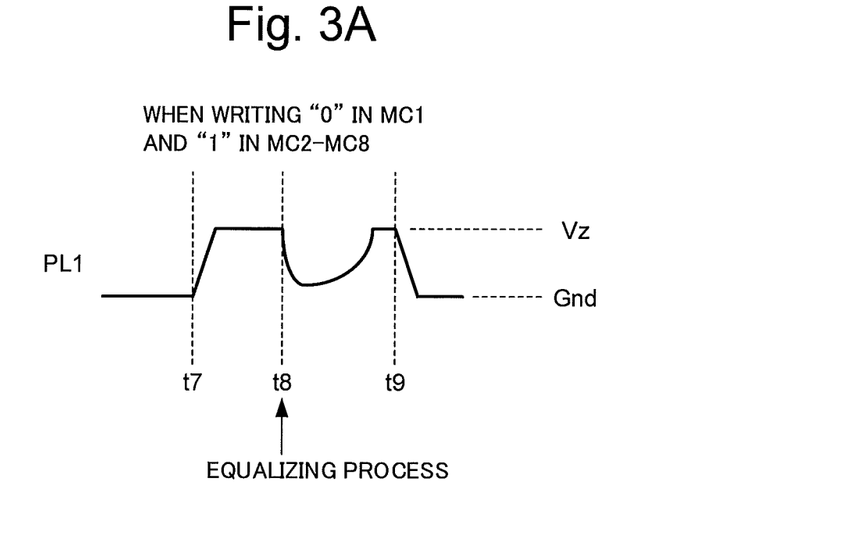
FIG. 3A is a drawing showing in detail a potential level of a plate line in an equalizing process in the FeRAM according to the first embodiment.

FIG. 3A is the drawing that shows in detail variation in the potential level of the plate line PL1 after writing data to the FeRAM 10, that is, from the time t7 to the time t9. There will be described noise received by the plate line PL1 at the time (time t8) of starting the equalizing process and the variation in the potential level of the plate line PL1, with reference to FIG. 3A.

A coupling noise received by the plate line PL1 during the equalizing process will be described. At the time t8, all the bit lines BL1 to BL8 of the memory cells MC1 to MC8 connected to the plate line PL1 are at the ground potential Gnd. The potential levels of bit lines BL1 to BL8 are different before the equalizing process, depending on data that has been written thereto. In this embodiment, the data "0" is written to the memory cell MC1, and the "1" is written to the memory cells MC2 to MC8.

Before the equalizing process, that is, at the time t7, the ground potential Gnd is applied to the bit line BL1, and the power source potential Vdd is applied to each of the bit lines BL2 to BL8. By performing the equalizing process in this state, the bit line BL1 is kept at the ground potential Gnd, while the potential of each of the bit lines BL2 to BL8 drops from the power source potential Vdd to the ground potential Gnd.

Accordingly, since capacitive coupling occurs in the capacitors CP1 to CP8, noise is generated in the direction of reducing the potential of the plate line PL1. In other words, the potential level of the plate line PL1 varies for a short time in the reduction direction. This is the noise received by the plate line PL1 owing to the equalizing process and the variation in the potential level of the plate line PL1 thereby. It is noted that the variation occurs in the potential level of the plate line PL1, provided that there are both a memory cell having the data "0" written therein and a memory cell having the data "1" written therein.

Figure 3B:
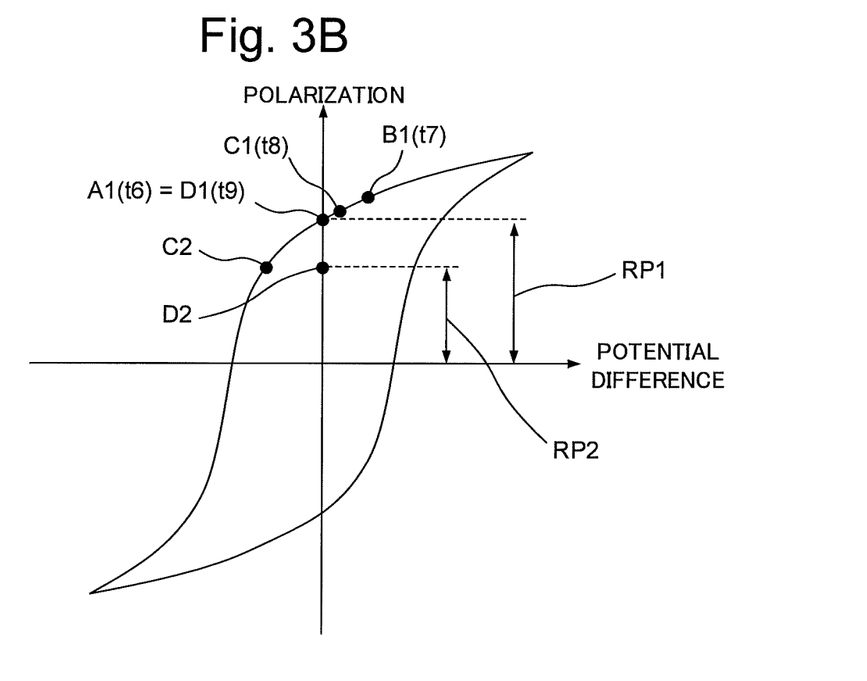
FIG. 3B is a graph showing the residual polarization value of data "0" before and after the equalizing process in FeRAMs according to the first embodiment and a comparative example.

FIG. 3B is the graph showing a hysteresis loop of a ferroelectric substance being a material of the capacitor CP1 of the memory cell MC1, and variation in the potential level of the bit line BL1 and a polarization state of the ferroelectric substance from the time t6 to the time t9. In FIG. 3B, a horizontal axis represents the potential difference between the bit line BL1 and the plate line PL1, and a vertical axis represents the polarization value of the capacitor CP1.

The residual polarization value of the ferroelectric substance of the memory cell MC1, due to the variation in the potential level of the plate line PL1, will be described with reference of FIG. 3B. Note that, as a comparative example, variation in the residual polarization value of the ferroelectric substance in a case where the noise absorption potential Vz is not applied to the plate line PL1 before the equalizing process, that is, in the case of omitting the time t7 are shown together. The comparative example uses a FeRAM that is provided with a plate line drive circuit having the same configuration as the plate line drive circuit 11 except that it does not have the function of applying the noise absorption potential Vz, and the plate line drive circuit drives the plate lines.

In this embodiment and the comparative example, the ferroelectric substance of the capacitor CP1 has a polarization state (polarization value) shown at a point A1 after writing the data "0", that is, at the time t6. Although the data "0" is written at the time t5 in this embodiment, the data "1" is written to the next memory cell MC2 at the time t6, so that the polarization state shown at the point A1 is brought about at the time t6. Also in the comparative example, the polarization state shown at the point A1 is brought about at the time t6.

Then, in this embodiment, the noise absorption potential Vz is applied to the plate line PL1 at the time t7. In this state, the potential Vz of the plate line PL1 is higher than the potential (ground potential Gnd) of the bit line BL1, and the potential difference rises to Vz. Thus, a polarization state shown at a point B1 is brought about at the time t7.

Then, the equalizing process is performed at the time t8, and the potential level of the plate line PL varies in the reduction direction, as described above. Since the plate line PL1 is in a state of being applied with the noise absorption potential Vz at the time t8, the potential level of the plate line PL1 does not fall short of the ground potential Gnd. In other words, the potential level of the plate line PL1 is kept higher than that of the bit line BL1. Thus, a polarization state shown at a point C1 is brought about at the time t8.

It is noted that in this embodiment, the plate line drive circuit 11 keeps applying the noise absorption potential Vz for a predetermined time period after the equalizing process. Thus, as shown in FIG. 3A, the potential level of the plate line PL1 drops for a short time and then returns to the noise absorption potential Vz. After that, at the time t9, the ground potential Gnd is applied to the plate line PL1, so that a polarization state shown at a point D1 is brought about. A residual polarization value RP1 of the capacitor CP1 according to this embodiment is shown in FIG. 3B.

In this embodiment, the plate line PL1 is pre-charged with the potential (noise absorption potential Vz) other than the ground potential Gnd before starting the equalizing process. Thus, since the plate line PL1 absorbs (blocks) the noise received by the plate line PL1 during the equalizing process, it is possible to prevent the effect of the noise from being transmitted to the memory cell MC1. This makes it possible to prevent reduction in the residual polarization value of the ferroelectric substance in the capacitor CP1 after the equalizing process. This allows providing the FeRAM with good data retention characteristics.

In the comparative example, on the other hand, the equalizing process is performed in a state such that the plate line PL1 is at the ground potential Gnd. In other words, the equalizing process is started in the polarization state shown at the point A1. The potential level of the plate line PL1 falls short of the ground potential Gnd for a short time owing to the noise. This makes the potential level of the plate line PL1 lower than that (ground potential Gnd) of the bit line BL1 for a short time, and the magnitude relation between the potentials of the plate line PL1 and the bit line BL1 is reversed. In other words, the plate line PL1 and the bit line BL1 are in a state of writing the data "1" for a short time. Then, the equalizing process brings about a polarization state shown at a point C2, so that the polarization value is reduced. Even if the potential level of the plate line PL1 returns to the ground potential Gnd, the polarization value does not return and the writing of data is completed in a state (residual polarization value RP2) with the reduced polarization value shown at a point D2. The residual polarization value RP2 is lower than the residual polarization value RP1.

When reading out the data "0" from the memory cell of the comparative example, the read potential is higher in the comparative example than in this embodiment. Therefore, since the read potential is close to the reference potential, the data judgment becomes unstable. If the read potential is higher than the reference potential, the data "1" is read out by mistake, even though the data "0" has been written in actual fact. Moreover, an increase in the read potential necessarily increases the reference potential, and causes an increase in electric power consumption. This embodiment improves or solves the above problems.

It is noted that the potential level of the noise absorption potential Vz can be determined in consideration of the pattern of the write data, the polarization value of the ferroelectric substance, the number of the capacitors connected, and the potential level of the power source potential Vdd. For example, the potential level of the noise absorption potential Vz is settable in consideration of the worst case, in which the data "0" is written to one bit and the data "1" is written to the remaining seven bits. Adjusting the noise absorption potential Vz to an appropriate potential level makes it possible to completely equalize the residual polarization value between before and after the equalizing process. In other words, as shown in FIG. 3B, it becomes possible to equate the residual polarization value between the time t6 (point A1) and the time t9 (point D1).

In the case of pre-charging the plate line PL1 with the noise absorption potential Vz, the polarization value drops by the noise absorption potential Vz in the memory cells MC2 to MC8 in which the data "1" has been rewritten, as well as in the memory cell MC1. However, a reduction in the residual polarization value is almost constant in the memory cells MC2 to MC8. Thus, since it is unnecessary to consider the effect of the variation in the potential level of the plate line PL1 due to the noise, the residual polarization value after the equalizing process can be calculated to some extent on the basis of the potential level of the noise absorption potential Vz.

In this embodiment, as to the memory cell in which the data "0" has been written, pre-charging the plate line PL1 with the noise absorption potential Vz, before starting the equalizing process, makes it possible to prevent a reduction in the residual polarization value, prevent an increase in the read potential, and provide the FeRAM with low power consumption. As to the memory cell in which the data "1" has been written, the residual polarization value can be intendedly reduced to a constant calculable value, and therefore the FeRAM with the good data retention characteristics can be provided. The number of (time for) screenings in a functional test can be reduced as a whole. Therefore, it is possible to provide the FeRAM that has good data retention characteristics and reduced power consumption.

This embodiment describes the case of driving the two plate lines PL1 and PL2 by the plate line drive circuit 11, but the configuration of the plate line drive circuit 11 is not limited thereto. For example, a plurality of plate line drive circuits each for driving one plate line may be provided in accordance with the number of the plate lines. The switch circuit SWC is separate from the plate line drive circuit 11 in this embodiment, but the plate line drive circuit 11 may include the switch circuit SWC. Note that, the configuration of having the plate line drive circuit 11 as a drive circuit shared with all the plate lines and driving any one of the plate lines in a selective manner, as described above, contributes to a simplification of the entire circuit configuration and a reduction in chip size.

[Second Embodiment]

Figure 4A:
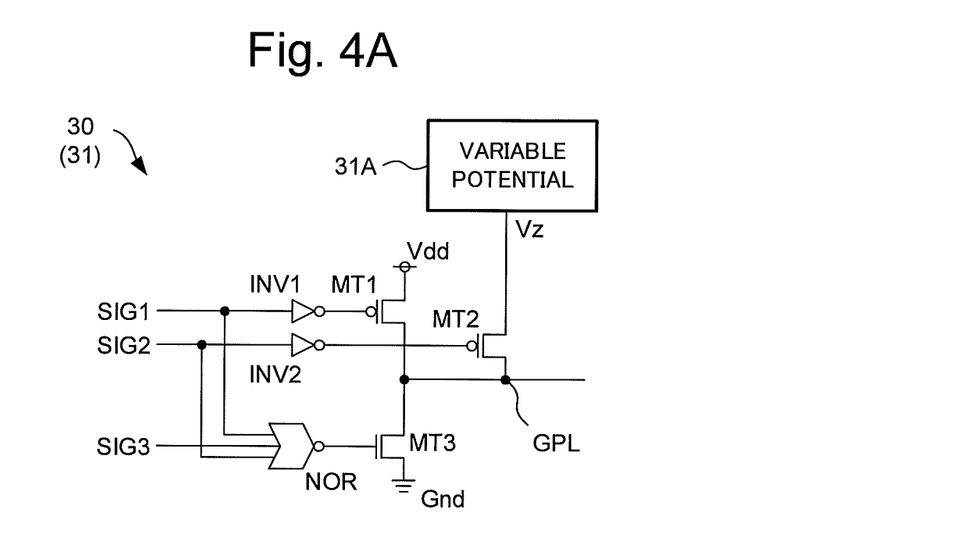
FIG. 4A is a circuit diagram showing a configuration of a plate line drive circuit in a FeRAM according to a second embodiment.

FIG. 4A is the circuit diagram showing a configuration of a plate line drive circuit 31 in a FeRAM 30 according to a second embodiment. The FeRAM 30 is identical to the FeRAM 10, except for the configuration of the plate line drive circuit 31.

The plate line drive circuit 31 has a variable potential generation circuit 31A that generates one potential of a plurality of potentials having potential levels different from each other between the ground potential Gnd and the power source potential Vdd, as the noise absorption potential Vz. The plate line drive circuit 31 stops applying the noise absorption potential Vz to the one plate line (for example, plate line PL1) at the time of starting the equalizing process. The plate line drive circuit 31 puts the potential of the one plate line PL1 into the floating state by using a control signal (third control signal) SIG3, at the time of starting the equalizing process. To be more specific, in addition to the control signals SIG1 and SIG2, the control signal SIG3 is input to the input terminal of the negative OR circuit NOR. As for the rest, the plate line drive circuit 31 has the same configuration as the plate line drive circuit 11.

Figure 4B:
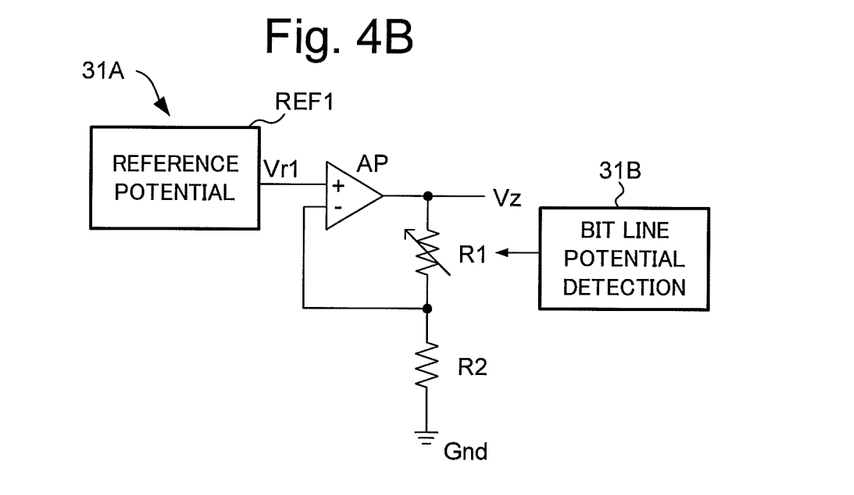
FIG. 4B is a circuit diagram showing a configuration of a variable potential generation circuit of the plate line drive circuit in the FeRAM according to the second embodiment.

FIG. 4B is the circuit diagram showing an example of the configuration of the variable potential generation circuit 31A. The variable potential generation circuit 31A has a variable resistor R1 the one end of which is connected to the source of the MOS transistor MT2. The variable resistor R1 has a resistance value that is varied on the basis of the potential level of each of the bit lines BL1 to BL8 at the time before starting the equalizing process (t8). To the other end of the variable resistor R1, one end of a resistor R2 is connected. The other end of the resistor R2 is grounded. The variable potential generation circuit 31A has a bit line potential detection circuit (hereinafter simply called detection circuit) 31B for detecting the potential level of each of the bit lines BL1 to BL8.

The variable potential generation circuit 31A has an operational amplifier AP the output terminal of which is connected to the end of the variable resistor R1. The reference potential Vr1 generated by the reference potential generation circuit REF1 is input to a non-inverting input terminal of the operational amplifier AP, while a potential at a connection point between the variable resistor R1 and the resistor R2 is input to an inverting input terminal of the operational amplifier AP. In other words, the variable potential generation circuit 31A generates, as the noise absorption potential Vz, "Vz=reference voltage Vr1×(1+(resistance value of variable resistor R1)/(resistance value of resistor R2))".

Figure 5:
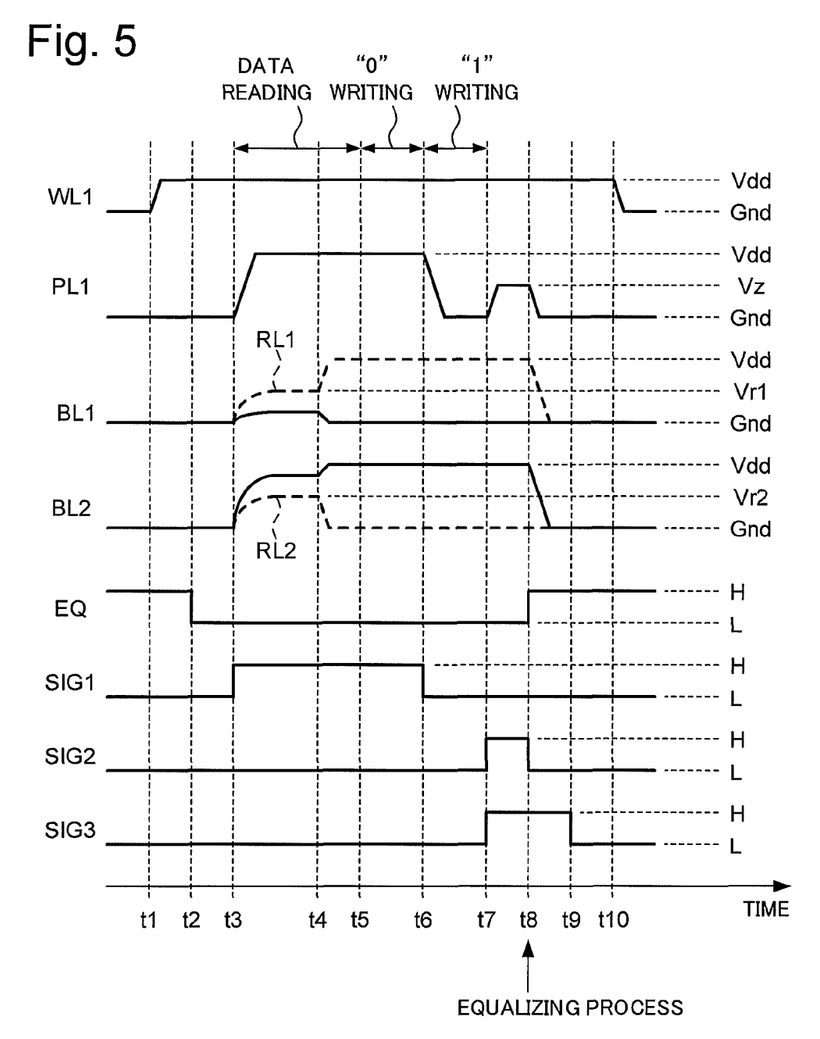
FIG. 5 is a time chart of a reading and writing operation of data in the FeRAM according to the second embodiment.

FIG. 5 is the time chart showing the sequential reading and writing operation on the FeRAM 30. FIG. 5 shows the potential levels of the word line WL1, the reference line RL1, the bit line BL1, the reference line RL1, the bit line BL2, and the reference line RL2 during reading and writing operation. For the sake of explanation, FIG. 5 shows waveforms (potential levels) of the equalizing signal EQ and the control signals SIG1, SIG2, and SIG3.

In FIG. 5, the FeRAM 30 is operated under the same conditions as in FIG. 2 till the time t6, and thus, the description thereof is omitted. The operation after writing the data "0" to the memory cell MC1 and writing the data "1" to the memory cells MC2 to MC8 in the FeRAM 30 will be described with reference to FIG. 5. The control signal SIG3 is kept at the level "L" so far. At the time t7, the control signal SIG2 rises to the level "H" to apply the noise absorption potential Vz to the plate line PL1. The control signal SIG3 also rises to the level "H".

Then, at the time t8, the equalizing signal EQ rises to the level "H" to perform the equalizing process in which the ground potential Gnd is applied to the bit lines BL1 and BL2 and the reference lines RL1 and RL2. The control signal SIG2 falls to the level "L" to stop applying the noise absorption potential Vz to the plate line PL1. Thus, the control signals SIG1 and SIG2 are at the level "L" and the control signal SIG3 is at the level "H", so that the potential level of the plate line PL1 becomes in the floating state.

At the time t9, the control signal SIG3 falls to the level "L", so that the plate line drive circuit 31 applies the ground potential Gnd to the plate line PL1. Then, at the time t10, the word line WL1 falls to the ground potential Gnd to cancel the selection of the memory cells.

FIGS. 6A to 6D are drawings showing variation in the potential level of the plate line PL1 before and after the equalizing process, in accordance with difference in data patterns. In the FeRAM 30, the plate line drive circuit 31 has the variable potential generation circuit 31A that generates the different noise absorption potentials Vz. The variable potential generation circuit 31A generates the different noise absorption potentials Vz depending on data that has been written in each of the memory cells MC1 to MC8. More specifically, the variable potential generation circuit 31A generates the noise absorption potentials Vz each having the almost same potential level as a reduction in the potential of the plate line PL1 in the equalizing process. Thereby, the reduction in the potential of the plate line PL1 in the equalizing process is the ground potential Gnd at the most.

In this embodiment, the plate line drive circuit 31 drives the plate line PL1 such that the potential level of the one plate line PL1 is in the floating state at the time of starting the equalizing process. Thus, even after the equalizing process, the potential of the plate line PL1 does not return to the noise absorption potential Vz, and is kept at a potential level reduced in the equalizing process. Thus, after the equalizing process, the potential level of the plate line PL1 is at almost the same level as the ground potential Gnd and kept at this level. Therefore, not only that the residual polarization value is not reduced in the memory cell having the data "0" written therein, but it is possible to prevent a reduction in the residual polarization value in the memory cell having the data "1" written therein.

Figure 6A:
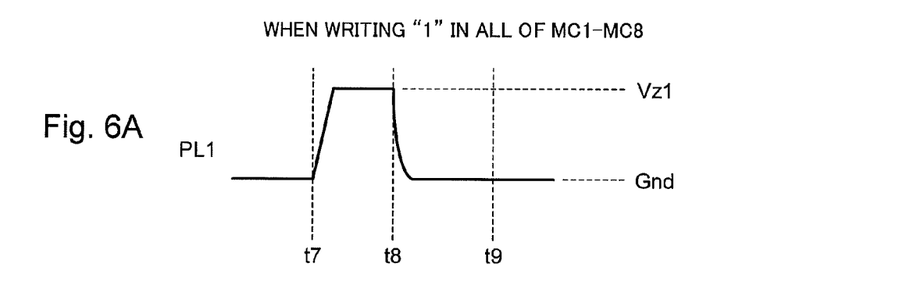
FIGS. 6A to 6D are drawings each showing in detail a potential level of a plate line in the equalizing process in the FeRAM according to the second embodiment.
Figure 6B:
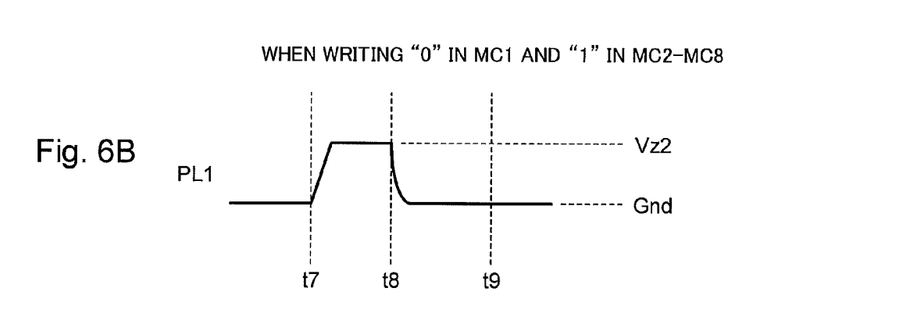

To be more specific, in this embodiment, in the case of writing the data "1" to all the memory cells MC1 to MC8, that is, the worst case, the variable potential generation circuit 31A generates the highest noise absorption potential (first noise absorption potential) Vz1 (see FIG. 6A). In the case of writing the data "0" to the one memory cell MC1 and writing the data "1" to the remaining seven memory cells MC2 to MC8, that is, the second worst case, the variable potential generation circuit 31A generates the second highest noise absorption potential (second noise absorption potential) Vz2 (see FIG. 6B).

Figure 6C:
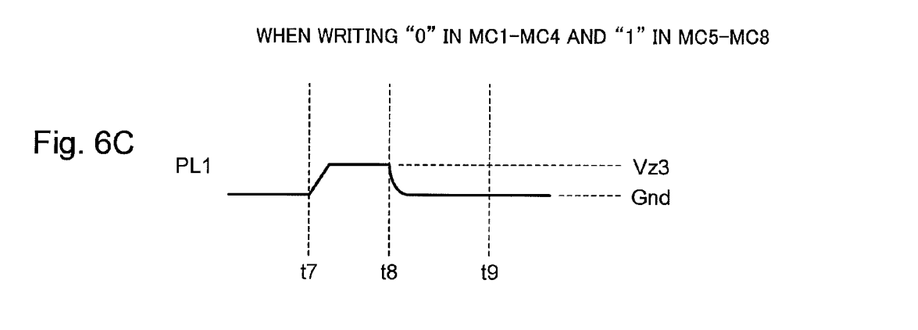
Figure 6D:
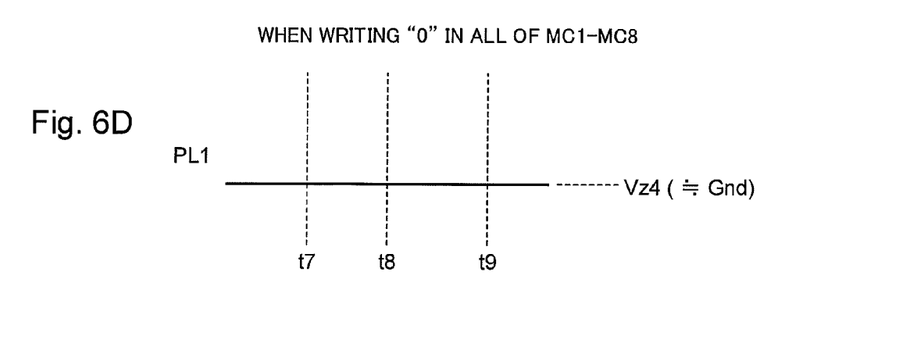

In the case of writing the data "0" to the four (a half number of) memory cells MC1 to MC4 and writing the data "1" to the remaining four memory cells MC5 to MC8, that is, a moderate case, the variable potential generation circuit 31A generates a moderate noise absorption potential (third noise absorption potential) Vz3 (see FIG. 6C). In the case of writing the data "0" to all the memory cells MC1 to MC8, that is, a condition in which the effect of noise is almost negligible, the variable potential generation circuit 31A generates the lowest noise absorption potential (fourth noise absorption potential) Vz4, which is close to the ground potential Gnd (see FIG. 6D).

In this embodiment, as shown in FIGS. 5 and 6A to 6D, the plate line drive circuit 31 pre-charges the plate line PL1 with the variable noise absorption potential Vz before the equalizing process. The plate line drive circuit 31 drives the plate line PL1 such that the potential of the plate line PL1 converges on the ground potential Gnd, at the same time as the equalizing process. Thus, just as with the first embodiment, it is possible to prevent a reduction in the residual polarization value of the ferroelectric capacitor in the memory cells having the data "0" written therein.

According to this embodiment, in the memory cells having the data "1" written therein, the potential difference between both ends of the ferroelectric capacitor (that is, the potential difference between the bit line and the plate line) hardly varies between before and after the equalizing process. Thus, it is possible to prevent a reduction in the residual polarization value of the ferroelectric capacitor in the memory cells having the data "1" written therein. That is to say, it is possible to prevent a deterioration in the data retention characteristics, irrespective of whether data to be written is the data "0" or the data "1".

It is noted that this embodiment can be combined with the first embodiment. For example, a plate line drive circuit that puts the potential level of the plate line PL1 into the floating state at the time of starting the equalizing process, though does not have the variable potential generation circuit 31A, can bring about a certain effect.

Figure 7:
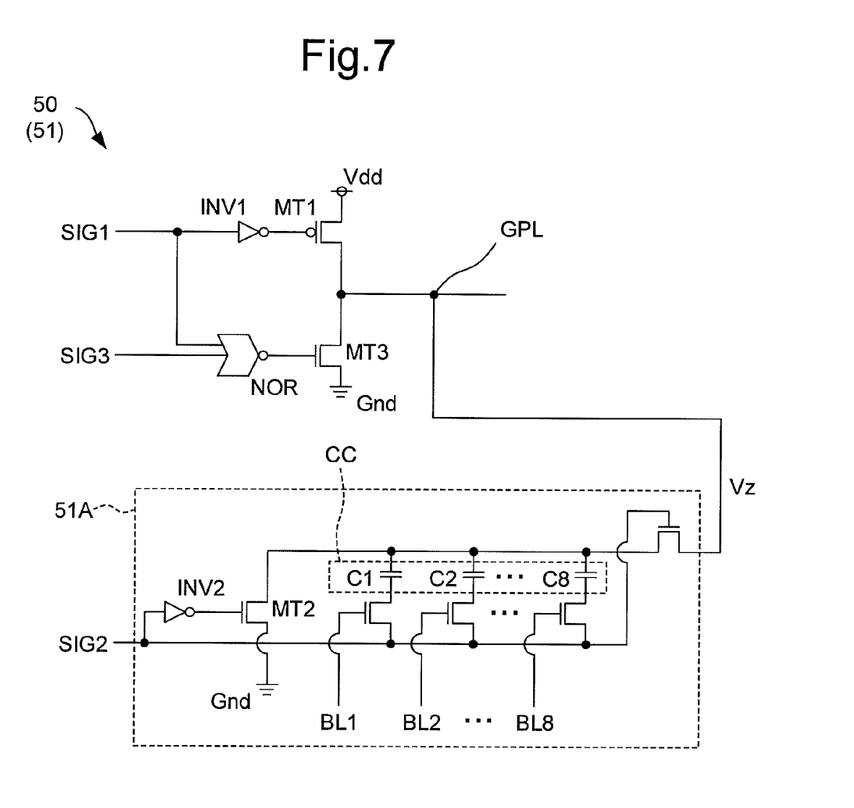
FIG. 7 is a circuit diagram showing a configuration of a plate line drive circuit in a FeRAM according to a third embodiment.

FIG. 7 is the circuit diagram showing a configuration of a plate line drive circuit 51 in a FeRAM 50 according to a modification example of the second embodiment. The FeRAM 50 is identical to the FeRAM 30 except for the configuration of the plate line drive circuit 51. The plate line drive circuit 51 has a variable potential generation circuit 51A, which generates a noise absorption potential Vz having a variable potential level between the ground potential Gnd and the power source potential Vdd. The plate line drive circuit 51 stops applying the noise absorption potential Vz to the one plate line PL1 at the time of starting the equalizing process. The plate line drive circuit 51 puts the potential of the one plate line PL1 into the floating state by using the control signal (third control signal) SIG3 at the time of starting the equalizing process.

The variable potential generation circuit 51A has a capacitor circuit CC the capacitance of which is variable on the basis of the potential levels of the individual bit lines BL1 to BL8 before starting the equalizing process. As shown in FIG. 7, the capacitor circuit CC has, for example, eight capacitors C1 to C8 for generating the variable potential connected in parallel with each other, which perform a charging and discharging operation upon application of the power source potential Vdd to the bit lines BL1 to BL8, respectively.

In this modification example, various noise absorption potentials Vz are generated using coupling of the capacitors C1 to C9 for generating the variable potential. In other words, the potential of the plate line PL1 is increased by using the coupling of the capacitors C1 to C9 for generating the variable potential. This modification example can obtain the same effect as in the second embodiment.

In the embodiments described above, the FeRAM has the memory cell block including the plurality of memory cells arrayed in the matrix of j rows and k columns, and the k plate lines each connected to the capacitors in the same column. In accordance with the selection of the word line, the plate line corresponding to the selected word line is driven. The FeRAM has the plate line drive circuit that selectively applies one of the first potential corresponding to the first logic level and the second potential, which corresponds to the second logic level and has a higher potential level than the first potential, to the one plate line.

In the plate line drive circuit, the third potential having the potential level between the potential levels of the first and second potentials is applied to the plate line to be driven, before starting the equalizing process by the equalizing circuit.

Therefore, in the 1T1C type FeRAM in which data is read from and written to the plurality of memory cells using shared plate lines, the effect of coupling noise of the ferroelectric capacitors on the residual polarization value of the ferroelectric substance is reduced. Therefore, it is possible to provide the FeRAM having good data retention characteristics.

This application is based on Japanese Application No. 2014-193886, which is incorporated herein by reference.

What is claimed is:
1. A ferroelectric random access memory comprising:
a memory cell matrix constituted by a plurality of 1T1C type memory cells of j rows and k columns (j is an integer of 2 or more and k is an integer of 1 or more), and having j bit lines, k word lines, and k plate lines, said k word lines and said k plate lines being paired with each other, and each of said plurality of 1T1C type memory cells being connected to one of said j bit lines and one pair of said k word lines and said k plate lines;
a word line drive circuit which selects either one word line of said k word lines in accordance with a selection signal;
a plate line drive circuit which selects one plate line of said k plate lines paired with the selected one word line, and selectively applies one of a first potential and a second potential having a higher potential level than the first potential to said one plate line during a data writing time period; and
an equalizing circuit which performs an equalizing process in which the first potential is applied to each of said j bit lines, wherein said plate line drive circuit applies, after said data writing time period, a third potential having a potential level between the first and second potentials to said one plate line, during a predetermined time period including a starting time of said equalizing process.

2. The ferroelectric random access memory according to claim 1, wherein said plate line drive circuit has a variable potential generation circuit which generates the third potential as a variable potential between the first and second potentials.

3. The ferroelectric random access memory according to claim 2, wherein said variable potential generation circuit generates one potential of a plurality of potentials having different potential levels, as the third potential.

4. The ferroelectric random access memory according to claim 1, wherein said word drive circuit applies the second potential to said selected one word line.

5. The ferroelectric random access memory according to claim 1, wherein said plate line drive circuit puts a potential level of said one plate line into a floating state immediately after said starting time of said equalizing process.

6. The ferroelectric random access memory according to claim 4, further comprising a switch circuit which electrically connects between said one plate line and said plate line drive circuit in accordance with the second potential applied to said selected one word line by said word drive circuit.

7. The ferroelectric random access memory according to claim 2, wherein said variable potential generation circuit includes a detection circuit which detects a potential level of each of said j bit lines, and a variable resistor having a resistance value which varies on the basis of the potential level of each of said j bit lines before starting the equalizing process.

8. The ferroelectric random access memory according to claim 2, wherein said variable potential generation circuit includes a capacitor circuit having a capacitance which varies on the basis of a potential level of each of said j bit lines before starting the equalizing process.

9. The ferroelectric random access memory according to claim 8, wherein said capacitor circuit has j capacitors that are connected in parallel with each other and performs a charging and discharging operation when the second potential is applied to each of said j bit lines.

10. The ferroelectric random access memory according to claim 1, wherein the first potential is a ground potential, and the second potential is a power source potential.

* * * * *